(12) United States Patent
Trodd et al.

(10) Patent No.: US 6,791,414 B2
(45) Date of Patent: Sep. 14, 2004

(54) SIGNAL PROCESSING STAGE AND RADIO FREQUENCY TUNER

(75) Inventors: Lance Trodd, Wiltshire (GB); Franco Lauria, Wiltshire (GB)

(73) Assignee: Zarlink Semiconductor Limited, Wiltshire (GB)

( * ) Notice: Subject to any disclaimer, the term of this patent is extended or adjusted under 35 U.S.C. 154(b) by 0 days.

(21) Appl. No.: 10/424,899

(22) Filed: Apr. 28, 2003

(65) Prior Publication Data

US 2003/0206055 A1 Nov. 6, 2003

(30) Foreign Application Priority Data

May 3, 2002 (GB) .............................................. 0210168

(51) Int. Cl.[7] .................................................. H03F 3/45
(52) U.S. Cl. .......................................... 330/254; 330/85
(58) Field of Search ......................... 330/254, 85, 260, 330/259; 358/27; 327/359

(56) References Cited

U.S. PATENT DOCUMENTS

| 4,287,476 A | * | 9/1981 | Cense ........................ 330/254 |
| 4,396,891 A | * | 8/1983 | Johansson et al. .......... 330/254 |
| 4,577,336 A | * | 3/1986 | Kriedt et al. ................ 377/111 |
| 6,577,188 B2 | * | 6/2003 | Ueno et al. .................... 330/85 |

FOREIGN PATENT DOCUMENTS

| EP | 0 525 029 | 8/1992 |
| EP | 0 720 287 | 12/1995 |

OTHER PUBLICATIONS

Search Report regarding corresponding Application No. GB 0210168.1 dated Dec. 2, 2002.

* cited by examiner

*Primary Examiner*—Henry Choe
(74) *Attorney, Agent, or Firm*—Renner, Otto, Boisselle & Sklar, LLP

(57) ABSTRACT

A signal handling stage provides variable gain, for example for automatic gain control functions, in a radio frequency tuner. The stage comprises a transconductance stage having negative feedback via further transconductance stage. The output current of the transconductance stage is supplied to an AGC core, which steers the output current between output loads and loads for driving the transconductance stage in accordance with an AGC voltage. The amount of negative feedback is therefore varied in accordance with the AGC voltage. For relatively low gain, a large amount of feedback is used and this improves the distortion performance. For relatively high gain, the negative feedback is reduced but a good noise figure can be achieved.

17 Claims, 4 Drawing Sheets

SIGNAL PROCESSING STAGE AND RADIO FREQUENCY TUNER

TECHNICAL FIELD

The present invention relates to a signal processing stage for a radio frequency tuner. The present invention also relates to a radio frequency tuner incorporating such a signal processing stage and for connection, for example, to a terrestrial aerial, a cable distribution system or a satellite aerial system.

BACKGROUND

EP 0 720 287 and EP 0 527 029 disclose arrangements for controlling the output power of radio frequency power amplifiers for mobile telephone use. The power amplifier output is attenuated by a controllable attenuator/amplifier and the power at the output of this is detected. The detected power is compared with a reference and the difference is used to control a variable gain stage ahead of the power amplifier.

U.S. Pat. No. 4,441,080 discloses a switched capacitor arrangement providing variable negative feedback around an op amp. There is no indication of possible uses of this arrangement.

SUMMARY

According to the first aspect of the invention, there is provided a signal processing stage for a radio frequency tuner, comprising an amplifier, a negative feedback loop, for applying negative feedback to the amplifier, and a gain control circuit responsive to a control signal for varying the amount of negative feedback in accordance with the control signal.

The amplifier may comprise a first transconductance stage. The first transconductance stage may comprise differentially connected first and second amplifying devices.

The negative feedback loop may comprise a second transconductance stage. The second transconductance stage may comprise differentially connected third and fourth amplifying devices.

The third and fourth devices may have output terminals connected to common terminals of the first and second devices, respectively. The first to fourth devices may be of the same conductivity type and the common terminals of the first and second devices may be connected together via a first resistance. The third and fourth devices may have common terminals connected via second and third resistances, respectively, to a first power supply terminal.

The first and second devices may be of a first conductivity type and the third and fourth devices may be of a second conductivity type opposite the first type. The common terminals of the first and second devices may be connected via fourth and fifth resistances, respectively, to a first constant current source. The third and fourth devices may have common terminals connected via sixth and seventh resistances, respectively, to a second constant current source.

The gain control circuit may be arranged to steer an output signal of the amplifier between an output of the signal processing stage and an input of the negative feedback loop in accordance with the control signal. The gain control circuit may comprise fifth and sixth amplifying devices having common terminals connected to an output terminal of the first device and seventh and eighth amplifying devices having common terminals connected to an output terminal of the second device, the fifth and eighth devices having control terminals connected to a first control signal input and the sixth and seventh devices having control terminals connected to a second control signal input. The fifth and eighth devices may have output terminals comprising differential outputs of the signal processing stage and connected via first and second loads, respectively, to a second power supply terminal. The sixth and seventh devices may have output terminals connected to the negative feedback loop and via third and fourth loads respectively, to a or the second power supply terminal.

Each of the amplifying devices may comprise a transistor, such as a bipolar transistor. In this case, the control, common and output terminals comprise the base, emitter and collector terminals of each transistor. More generally, the control terminal of an amplifying device controls the current flow between the common and output terminals and the signal at the output terminal is inverted with respect to the signal at the control terminal. Conductivity type refers to the direction of current flow between the common and output terminals.

According to the second aspect of the invention, there is provided a radio frequency tuner comprising at least one stage according to the first aspect of the invention.

The at least one stage may comprise at least one of a low noise amplifier, a mixer, an intermediate frequency amplifier and a baseband stage.

The tuner may comprise at least one automatic gain control signal generator for generating the control signal for the at least one stage.

It is thus possible to provide an arrangement of improved performance. For example, when used to provide automatic gain control, the greatest level of negative feedback is applied for the highest signal level at the amplifier, so that the intermodulation distortion performance, such as IP3, is substantially improved. For lower signal levels, the negative feedback is reduced but the noise performance can be substantially improved. Because of the lower signal levels, the inter-modulation performance is not required to be as good as for higher signal levels so that an overall improvement in performance for signals of any level can be achieved.

DETAILED DESCRIPTION

Figure 1:
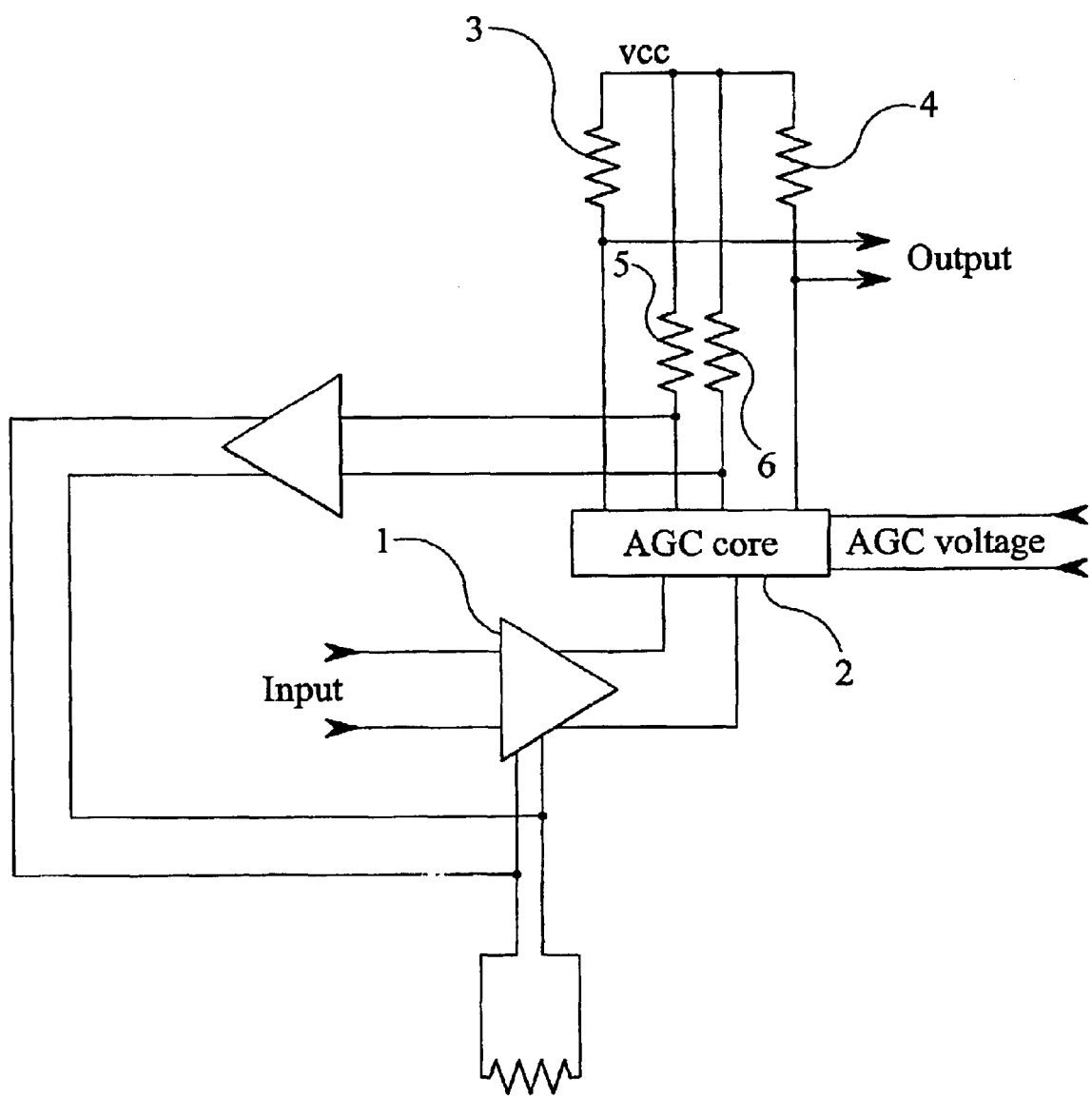
FIG. 1 is a block circuit diagram of a radio frequency tuner stage constituting an embodiment of the invention.

The signal processing stage shown in FIG. 1 is intended for use in a radio frequency tuner as described hereinafter. The stage comprises an amplifier 1 in the form of a transconductance stage having differential inputs connected to the stage input. The transconductance stage 1 has differential outputs connected to the signal input of an automatic gain control (AGC) "core", which has differential inputs for receiving an AGC voltage for controlling the gain of the stage in accordance with an AGC strategy within the tuner.

The core 2 has first differential outputs which are connected to an output of the stage and which are connected via first and second load resistances 3 and 4, respectively, to a power supply line VCC. The core 2 has second differential outputs which are connected via third and fourth load resistances, 5 and 6, respectively, to the supply line VCC and to the differential inputs of a second transconductance stage 7 forming part of a negative feedback loop around the amplifier 1. The stage 7 has differential outputs connected to differential negative feedback inputs of the transconductance stage 1, which inputs are illustrated as being connected together via a degeneration resistance 8, for example to provide emitter degeneration in the case of bi-polar junction transistors.

The transconductance gm of the first stage 1 is given by 1/(RE+re), whereas RE is the resistance of the resistor 8 and re is a non-linear resistor, for example comprising the diode resistance of one or more transistors. The transconductance of the second stage 7 is represented by gmf.

In use, an input signal is supplied to the differential inputs of the transconductance stage 1 and is transformed into a differential output current. The output current is steered by the core 2 between the first and second differential outputs in accordance with the AGC voltage supplied to the core. In the case where the AGC voltage is a monotonic function of the amplitude of the signal level at the signal processing stage, as the signal level increases, the AGC voltage causes the core 2 to supply more of the differential signal current to the load resistances 5 and 6 and less of the signal current to the load resistances 3 and 4. Conversely, when the signal level falls, more current is diverted to the load resistances 3 and 4 and less through the load resistances 5 and 6. Thus, as the signal level increases, the gain of the signal processing stage is reduced and the negative feedback is increased.

The voltages developed across the resistances 5 and 6 are supplied to the differential inputs of the second stage 7 which converts this to corresponding differential output currents. The output currents are injected into the feedback input nodes of the first stage 1. This differential current is applied across the degeneration resistance RE and provides current feedback.

The transfer function of the signal processing stage shown in FIG. 1 is given by:

$$\frac{Output}{Input} = \frac{RL.A}{(1 + gmf.RB[1 - A])RE + re} \quad (1)$$

where A is the fraction of the signal current steered by the AGC core 2 into the load resistances 3 and 4 and has a value between zero for zero signal current and one for full signal current, RL is the resistance of each of the resistances 3 and 4, RB is the resistance of each of the resistances 5 and 6, and the other variables are as defined hereinbefore.

In the absence of the negative feedback loop around the first transconductance stage 1 and the AGC core 2, the transfer function would be:

$$\frac{Output}{Input} = \frac{RL.A}{RE + re} \quad (2)$$

The effective value of the resistance 8 is therefore boosted by a factor of (1+gmf.RB(1−A)) by the effect of the negative feedback. The effective value is therefore increased most when the AGC voltage requires a minimum gain of the signal processing stage, for example corresponding to a relatively high signal amplitude at this stage. The stage linearity and distortion performance, such as IP3, are thus increased for higher signal levels and a desired performance can be achieved for a relatively low actual value RE of the degeneration resistance 8.

When the signal level at this stage is relatively low, the differential output current of the first stage 1 is steered exclusively to the output load resistances 3 and 4 so that the negative feedback is effectively removed. The transfer function is therefore given by equation (2) and the distortion performance is at its worst for the signal processing stage. However, because the signal level is relatively low, the distortion performance is adequate for permitting acceptable reception. Also, because of the relatively low value RE of the resistance 8, the noise figure is substantially improved and this helps to maintain an adequate signal-to-noise ratio. Thus, improvements in performance of the signal processing stage are provided substantially throughout the range of signal levels at this stage.

Figure 2:
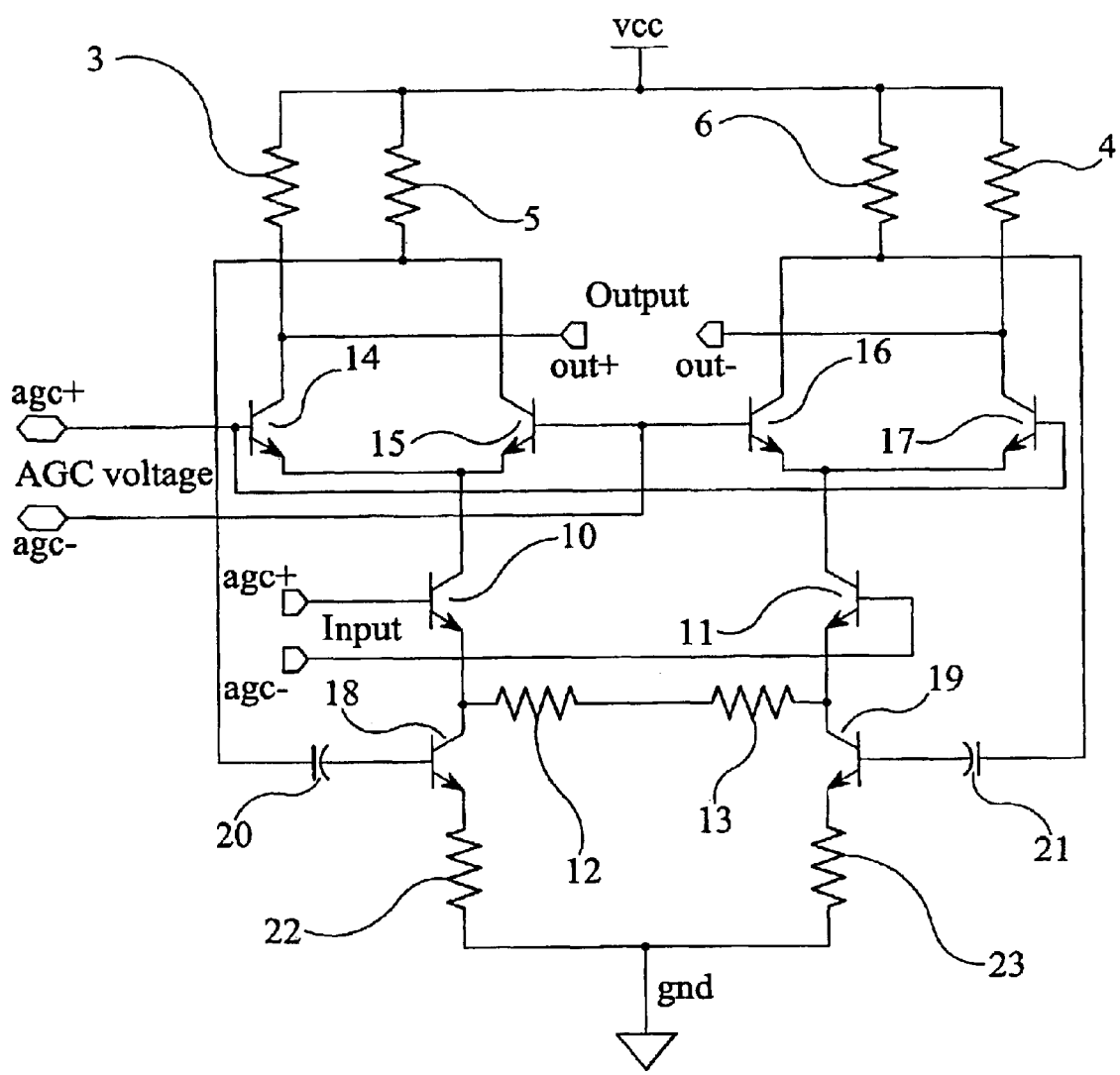
FIG. 2 is a circuit diagram illustrating a first example of the stage of FIG. 1.

FIG. 2 shows in detail a first example of the signal processing stage of FIG. 1 in the form of a fully differential circuit arrangement. The first transconductance stage 1 comprises first and second differentially connected transistors 10 and 11 and emitter degeneration resistors 12 and 13, each of which has the value RE. The diode resistance of each of the transistors 10 and 11 is re. The bases of the transistors 10 and 11 are connected to the differential inputs in+ and in−, respectively.

The AGC core 2 comprises transistors 14 to 17 with the emitters of the transistors 14 and 15 being connected to the collector of the transistor 10 and the emitters of the transistors 16 and 17 being connected to the collector of the transistor 11. The bases of the transistors 14 and 17 are connected to a first control input agc+ whereas the bases of the transistors 15 and 16 are connected to a second control input agc− for the AGC voltage. The collectors of the transistors 14 and 17 are connected to the differential outputs out+ and out− and to the load resistors 3 and 4 whereas the collectors of the transistors 15 and 16 are connected to the load resistors 5 and 6 and to the input of the negative feedback loop.

The second transconductance stage 7 comprises transistors 18 and 19 whose bases are connected via coupling capacitors 20 and 21 to the collectors of the transistors 15 and 16, respectively. The collectors of the transistors 18 and 19 are connected to the emitters of the transistors 10 and 11, respectively, whereas the emitters of the transistors 18 and 19 are connected via resistors 22 and 23, respectively, to ground gnd.

In the example shown in FIG. 2, all of the transistors are bipolar junction transistors of NPN type.

A simplified distortion analysis of the circuit of FIG. 2 gives an overall third harmonic distortion D3 of:

$$D3 = \frac{1}{48}\left(\frac{Vina}{Vt}\right)^2 \times \frac{1}{(1 + gmREq)^3} + \frac{1}{48}\left(\frac{Vinb}{Vt}\right)^2 \times \frac{1}{(1 + gmfRE2)^3} \quad (3)$$

where REq=(1+gmfRB[1−A])RE, Vina is the differential input voltage at the differential inputs in+ and in−, Vinb is the differential voltage between the bases of the transistors 18 and 19, Vt is the thermal voltage, RE2 is the resistance of each of the resistors 22 and 23, RB is the resistance of each of the resistors 5 and 6, and RE is the resistance of each of the resistors 12 and 13. When A is at a minimum corresponding to a relatively high signal level at this stage, the third harmonic distortion D3 is substantially reduced by the action of the negative feedback loop so that an adequate performance can be achieved for a relatively low resistance RE for each of the resistors 12 and 13. Conversely, for relatively low signal levels when A is higher, the distortion performance is less good, but is adequate for the lower signal levels in order to achieve an acceptable performance. The lower value RE of each of the resistors 12 and 13 provides an improved noise performance for relatively low signal levels.

Figure 3:
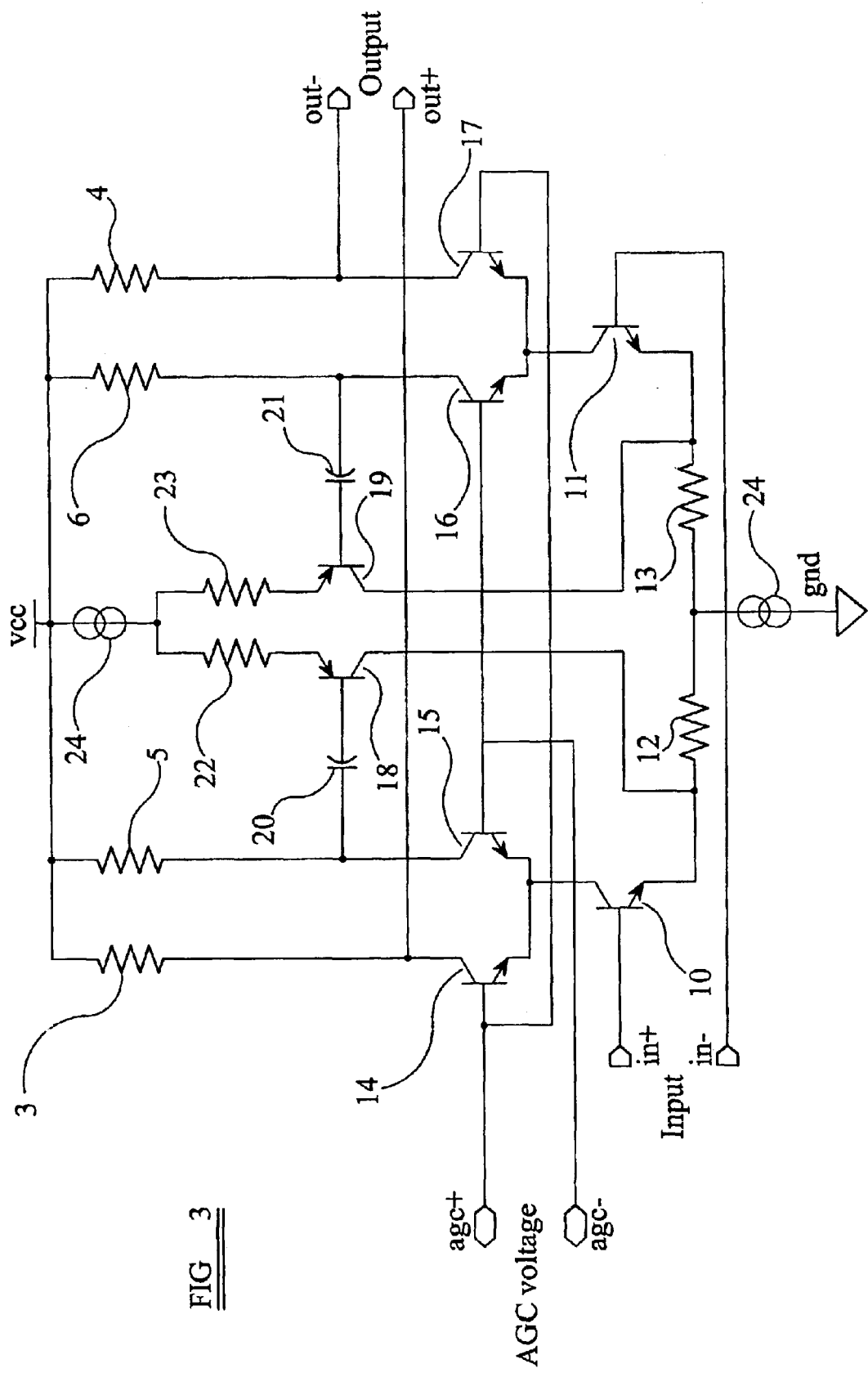
FIG. 3 is a circuit diagram illustrating a second example of the stage of FIG. 1.

FIG. 3 shows in detail a second example of the signal processing stage of FIG. 1. This example differs from that of FIG. 2 in that the transistors 18 and 19 are of PNP type. The emitters of the transistors 10 and 11 are connected via the resistors 12 and 13 to a first terminal of a constant current source 24, whose second terminal is connected to ground gnd. The emitters of the transistors 18 and 19 are connected via the resistors 22 and 23, respectively, to a first terminal of another constant current source 25, whose second terminal is connected to the supply line vcc. The coupling capacitors 20 and 21 may be omitted if the second constant current source 25 is of the appropriate type.

Figure 4:
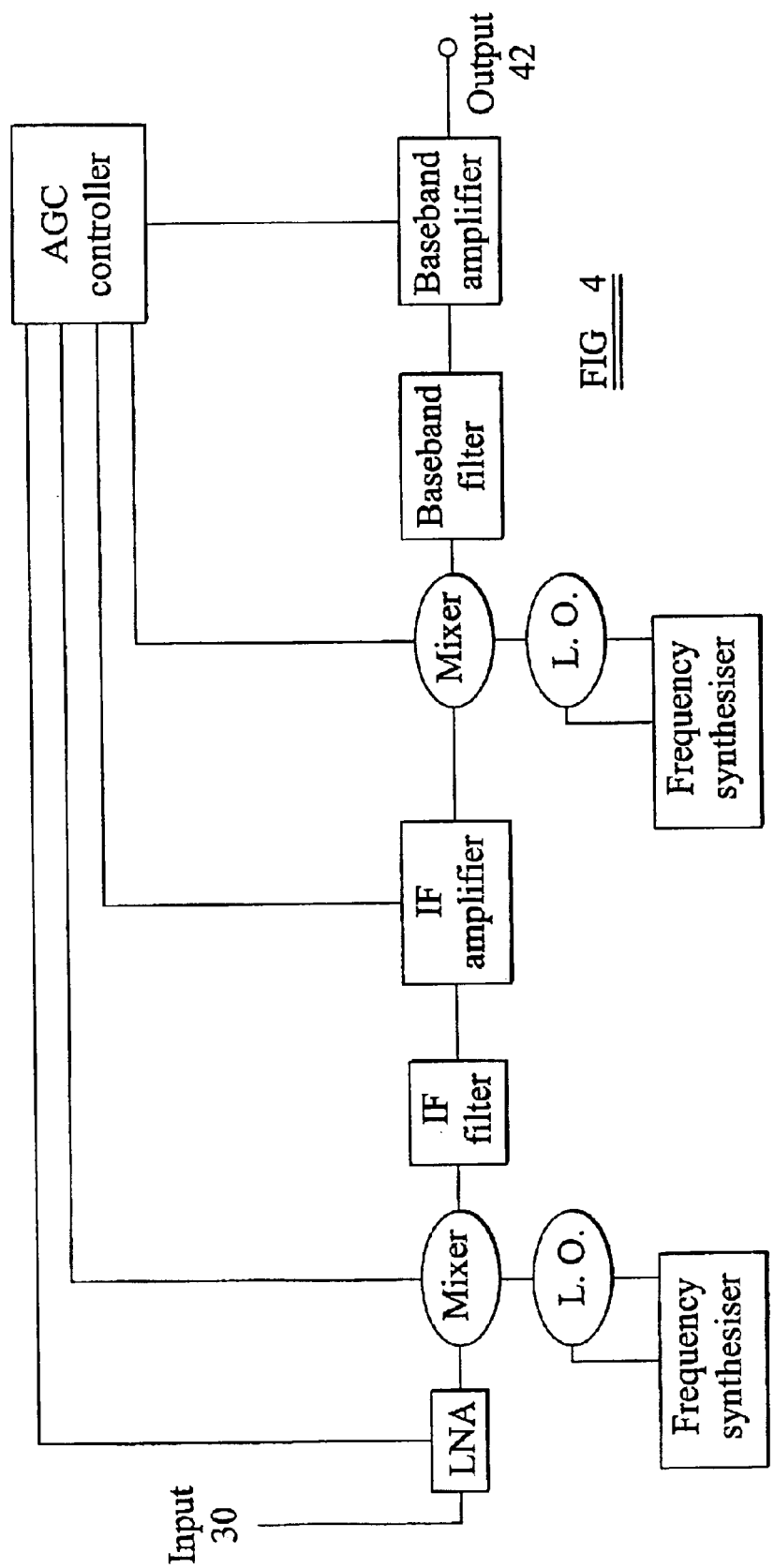
FIG. 4 is a block schematic diagram of a radio frequency tuner including one or more stages of the type shown in FIG. 1.

The radio frequency tuner shown in FIG. 4 has an input 30 for connection to a terrestrial aerial, a cable distribution system or a satellite aerial system and is of the dual conversion zero intermediate frequency type. The tuner comprises a low noise amplifier (LNA) 31 whose output is connected to a frequency changer comprising a mixer 32 and a local oscillator 33 controlled by a frequency synthesiser 34. The output of the mixer 32 is supplied via an intermediate frequency (IF) filter 35 to an intermediate frequency amplifier 36. The output of the amplifier 36 is supplied to a second frequency changer comprising a mixer 37 and a local oscillator 38 controlled by a frequency synthesiser 39. The output of the mixer 37 is supplied via a baseband filter 40 to a baseband amplifier 41 connected to the tuner output 42.

A broadband input signal comprising many channels available for reception is supplied to the input 30 and amplified by the LNA 31. The first frequency changer is controlled so as to select a channel for reception and this channel is converted to the first intermediate frequency. Following filtering in the filter 35 and amplifying in the amplifier 36, the second frequency changer converts the desired channel from the first intermediate frequency to zero intermediate frequency. The resulting baseband signal is further filtered by the filter 40 and amplified by the amplifier 41 before being supplied to the output 42 for subsequent demodulation.

Each of the stages 31, 32, 36, 37 and 41 is arranged to provide automatic gain control and is of the type illustrated in FIG. 1 and exemplified in FIG. 2 or 3. Thus, each of these stages has a control input for receiving a gain control signal. Suitable gain control signals are supplied, for example, from a subsequent demodulator (not shown) or may be generated within the tuner, for example by signal level detectors. A representative AGC controller is illustrated at 43.

Although all of the stages 31, 32, 36, 37 and 41 are shown as being of the type shown in FIG. 1, this is merely by way of illustrative example to show where such a stage may be applied in a typical tuner architecture. In general, not all of these stages will be required to provide an automatic gain control function so at least some of these stages may be of conventional type. It is common for the LNA 31 to provide automatic gain control because the broadband signal supplied to the input 30 can have a power or level which varies greatly. It may therefore be particularly advantageous to use a stage of the type shown in FIGS. 1 to 3 for the LNA 31. Such an arrangement has a good distortion performance for high signal levels and a good noise performance for low signal levels so that the signal-to-noise-plus-intermodulation performance is improved and can readily be made adequate for any modulation standard.

What is claimed is:

1. A signal processing stage for a radio frequency tuner, comprising an output, an amplifier, a negative feedback loop for applying negative feedback to said amplifier, and having an input, and a gain control circuit responsive to a control signal for varying an amount of negative feedback in accordance with said control signal, said gain control circuit being arranged to steer an output signal of said amplifier between said output of said signal processing stage and said input of said negative feedback loop in accordance with said control signal.

2. A stage as claimed in claim 1, in which said amplifier comprises a first transconductance stage.

3. A stage as claimed in claim 2, in which said first transconductance stage comprises differentially connected first and second amplifying devices.

4. A stage as claimed in any claim 1, in which said negative feedback loop comprises a second transconductance stage.

5. A stage as claimed in claim 4, in which said second transconductance stage comprises differentially connected third and fourth amplifying devices.

6. A stage as claimed in claim 5, in which said first transconductance stage comprises differentially connected first and second amplifying devices having common terminals and said third and fourth devices have output terminals connected to said common terminals of said first and second devices, respectively.

7. A stage as claimed in claim 6, in which said first to fourth devices are of a same conductivity type and a first resistance connecting together said common terminals of said first and second devices.

8. A stage as claimed in claim 7, comprising second and third resistances and a first power supply terminal and in which said third and fourth devices have common terminals connected via said second and third resistances, respectively, to said first power supply terminal.

9. A stage as claimed in claim 6, in which said first and second devices are of a first conductivity type and said third and fourth devices are of a second conductivity type opposite said first type.

10. A stage as claimed in claim 9, comprising a first constant current source and fifth and sixth resistances connecting said common terminals of said first and second devices, respectively, to said first constant current source.

11. A stage as claimed in claim 9, in which said third and fourth devices have common terminals and comprising a second constant current source and sixth and seventh resistances connecting said common terminals of said third and fourth devices, respectively, to said second constant current source.

12. A stage as claimed in claim 1, comprising first and second control signal inputs and in which said first transconductance stage comprises differentially connected first and second amplifying devices having output terminals and said gain control circuit comprises fifth and sixth amplifying devices having common terminals connected to said output terminal of said first device and seventh and eighth amplifying devices having common terminals connected to said output terminal of said second device, said fifth and eighth devices having control terminals connected to said first control signal input and said sixth and seventh devices having control terminals connected to said second control signal input.

13. A stage as claimed in claim 12, comprising first and second loads and a second power supply terminal and in which said fifth and eighth devices have output terminals forming differential outputs of said signal processing stage and connected via said first and second loads to said second power supply terminal.

14. A stage as claimed in claim 13, comprising third and fourth loads and in which said sixth and seventh devices have output terminals connected to said negative feedback loop and via said third and fourth loads, respectively, to said second power supply terminal.

15. A radio frequency tuner having at least one signal processing stage for a radio frequency tuner, comprising an output, an amplifier, a negative feedback loop for applying negative feedback to said amplifier and having an input, and a gain control circuit responsive to a control signal for varying an amount of negative feedback in accordance with said control signal, said gain control circuit being arranged to steer an output signal of said amplifier between said output of said signal processing stage and said input of said negative feedback loop in accordance with said control signal.

16. A tuner as claimed in claim 15, in which said at least one stage comprises at least one of a low noise amplifier, a mixer, an intermediate frequency amplifier and a baseband stage.

17. A tuner as claimed in claim 15, comprising at least one automatic gain control signal generator for generating said control signal for said at least one stage.

* * * * *